(12) United States Patent
Pelletier et al.

(10) Patent No.: US 8,324,814 B2
(45) Date of Patent: Dec. 4, 2012

(54) DEVICE AND METHOD FOR PRODUCING AND/OR CONFINING A PLASMA

(75) Inventors: Jacques Pelletier, Saint Martin d'Heres (FR); Ana LaCoste, Saint Martin le Vinoux (FR); Stéphane Bechu, Chantesse (FR)

(73) Assignees: Centre National de la Recherche Scientifique (CNRS), Paris (FR); Universite Joseph Fourier—Grenoble 1, St. Martin d'Heres (FR)

( * ) Notice: Subject to any disclaimer, the term of this patent is extended or adjusted under 35 U.S.C. 154(b) by 460 days.

(21) Appl. No.: 12/374,478

(22) PCT Filed: Jul. 4, 2007

(86) PCT No.: PCT/EP2007/056760
§ 371 (c)(1),
(2), (4) Date: Dec. 14, 2009

(87) PCT Pub. No.: WO2008/009559
PCT Pub. Date: Jan. 24, 2008

(65) Prior Publication Data
US 2010/0109532 A1 May 6, 2010

(30) Foreign Application Priority Data
Jul. 21, 2006 (FR) ...................................... 06 06680

(51) Int. Cl.
*H01J 7/24* (2006.01)
*C23C 16/50* (2006.01)
(52) U.S. Cl. ............................ 315/111.71; 118/723 MR (58) Field of Classification Search .......... 118/723 MW, 118/723 MR, 723 MA, 723 AN, 723 I; 315/111.21, 315/111.41, 111.51, 111.71
See application file for complete search history.

(56) References Cited

U.S. PATENT DOCUMENTS

| 4,181,866 | A | * | 1/1980 | Morisawa | ................. 310/154.04 |
| 5,133,826 | A | * | 7/1992 | Dandl | ....................... 156/345.42 |
| 5,370,765 | A | * | 12/1994 | Dandl | .............................. 216/69 |
| 5,767,628 | A | * | 6/1998 | Keller et al. | ............. 315/111.51 |
| 5,975,014 | A | * | 11/1999 | Dandl | ................... 118/723 MW |
| 6,022,446 | A | * | 2/2000 | Shan et al. | ................ 156/345.46 |
| 7,551,265 | B2 | * | 6/2009 | Phillips | ........................... 355/75 |
| 7,574,974 | B2 | * | 8/2009 | Lagarde et al. | ........ 118/723 MW |
| 2005/0194910 | A1 | | 9/2005 | Vukovic et al. | |

FOREIGN PATENT DOCUMENTS

| FR | 2 797 372 | 2/2001 |
| FR | 2 838 020 | 10/2003 |
| FR | 2 840 451 | 12/2003 |

* cited by examiner

*Primary Examiner* — Minh D A
(74) *Attorney, Agent, or Firm* — Blakely, Sokoloff, Taylor & Zafman (57) ABSTRACT

The invention concerns a device for producing and/or confining a plasma (10), comprising a recipient (13) within the volume of which the plasma is produced or confined, wherein said recipient comprises a wall (1) defining a lining (15) at the inside of the recipient and encompassing the volume, characterized in that it comprises at least one annular magnet (30), centered around a normal (14) with respect to the lining, having radial magnetization direction, such that the magnetization direction is significantly perpendicular to said normal to the lining. The invention also concerns a method for producing and/or confining a plasma.

13 Claims, 4 Drawing Sheets

DEVICE AND METHOD FOR PRODUCING AND/OR CONFINING A PLASMA

This is a non-provisional application claiming the benefit of International application number PCT/EP2007/056760 filed Jul. 4, 2007.

GENERAL FIELD OF THE INVENTION

The invention relates to a device for producing and/or confining a plasma, comprising a chamber, in the volume of which the plasma is produced or confined, which chamber includes a wall defining an envelope inside the chamber and surrounding the volume.

The invention also relates to a method for producing and/or confining a plasma.

PRIOR ART

The confinement of plasmas in a volume by permanent magnets has been widely used for many years, due to the increase in performance that it allows in terms of density and uniformity of the plasma.

Since 1974, the technique has not evolved, since the confinement of the plasma is generally performed by placing, at the periphery of the confinement volume, inside or outside of the chamber walls, permanent magnets presenting the plasma with alternate north and south polarities, hence the name multipole magnetic confinement.

As soon as 1975, a study was conducted in order to determine the best arrangement and the optimal distance between permanent magnets. This study showed that it was the continuous linear structures, and not the interrupted linear or checkerboard structures, that provided the best confinement. By contrast, the distance between magnets, which has a relatively flat maximum, appears to be less critical.

Finally, in 1992, a better understanding of the multipole magnetic confinement mechanisms made it possible to propose, in order to improve the efficacy of the confinement, closing the multipole magnetic structures on themselves in the manner of "magnetron" structures.

The principle of multipole confinement of plasma, and in particular of electrons that produce the plasma, now appears to be well known. Indeed, the charged particles entering the region influenced by a multiple magnetic field:

1) are reflected by said magnetic field and are sent back to the region free of a magnetic field from which they came (mechanism that we will call "mechanism 1");

2) or entirely pass the magnetic field region in regions where their trajectory is almost parallel to the magnetic field lines, since there is then no coupling between the charged particle and the magnetic field (mechanism that we will call "mechanism 2"). This is the case of charged particles that arrive from the area without a magnetic field, either directly at the pole of the magnets, or directly in the magnetic field area of zero intensity located between two magnets with the same polarity (alternate unitary magnets);

3) or are trapped in the multipole magnetic field by a collision mechanism (mechanism that we will call "mechanism 3").

In other words, the only charged particles that are lost for the plasma are:

those that are trapped on the field lines (mechanism 3) that pass through the material surfaces, and those that arrive from the volume free of a magnetic field at the regions of convergence of the magnetic field lines (mechanism 2), i.e. either at the magnetic poles (maximum magnetic intensity), or between two magnets of the same polarity (zero minimum magnetic intensity). These areas of convergence of the magnetic field lines are called "cusps".

Figure 1:
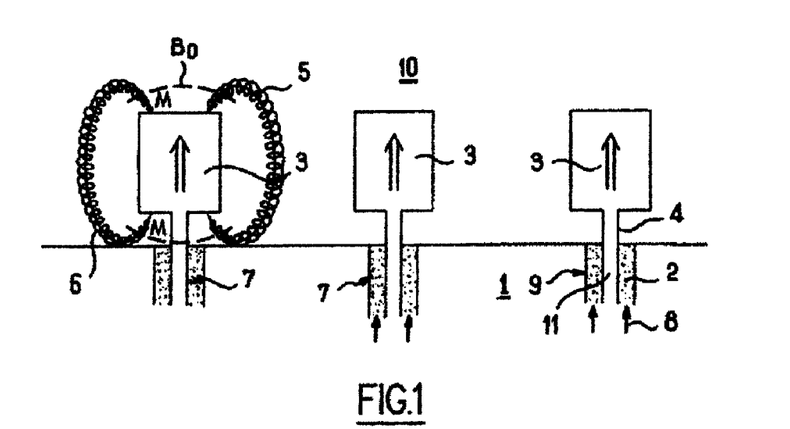
FIGS. 1 and 2, already discussed, diagrammatically show assemblies according to the prior art.

The energetic electrons that produce the plasma (called rapid or primary electrons) are insensitive to the self-consistent electric field produced by the plasma space charge. Once trapped in the magnetic field $B_0$, as shown in FIG. 1, in the interval between two elastic or inelastic collisions, the electrons 6 oscillate between two mirror points M (where the intensity of the magnetic field is identical). The mirror points M are located facing two opposite magnetic poles of the magnets 3. The electrons 6 oscillate between the points M by winding around an average field line 5. Their trajectories remain inscribed between two magnetic field lines of constant intensity.

Unlike the aforementioned rapid electrons, which are insensitive to the electric field of the plasma, as indicated, the low-energy ions and electrons of the plasma (called slow or thermal electrons), which also oscillate between two opposite magnetic poles, are sensitive to the electric field of the plasma and diffuse collectively in the magnetic field, under the influence of said electric field.

Finally, aside from these oscillation and diffusion movements, the charged particles drift along and around the magnets, perpendicularly to the plane that contains the vector of the magnetic field generated by the magnetic structure. It is for this reason that it is highly preferable to close the magnetic field structures on themselves (magnetron, ring, comb or track-type structures) so as to prevent losses of charged particles at the ends of the continuous magnetic structures.

In the multipole magnetic confinement structures, the plasma was originally produced by electrons emitted by heat-emitting filaments located inside of the confinement structure and negatively polarized with respect to the chamber and the magnetic structure.

In fact, the plasma can also be produced in the chamber or at the periphery thereof by any suitable means or method. In fact, any type of excitation of the plasma can be envisaged, regardless of the excitation frequency and excitation mode (Electron Cyclotron Resonance (or ECR), continuous discharge, pulsed discharge, low frequency LF discharge, radiofrequency RF discharge, surface wave, inductive discharge, magnetron discharge, and so on).

It is even possible to use the magnetic confinement structures to excite the plasma, either by applying a negative continuous or continuous pulsed voltage or a LF or RF voltage to the structure, or by applying microwaves for distributed cyclotron electron resonance (DECR) excitation.

One of the means for confining and producing plasmas of large dimensions maintained by HF fields, primarily in the microwave range (typically above one hundred MHz), is to distribute elementary sources according to two- or three-dimensional arrays.

Microwave plasma sources distributed according to a two-dimensional array make it possible to produce planar sources (or left, of large dimensions), while sources distributed according to a three-dimensional array, as non-limiting examples, make it possible to produce plasma volumes, for example in a cylindrical or spherical reactor.

Examples of devices are disclosed in FR 2 797 372, FR 2 838 020 and FR 2 840 451.

FR 2 797 372 and FR 2 838 020 disclose devices making it possible to produce, at low pressure ($10^{-2}$ to several Pa), planar or cylindrical plasmas from elementary sources maintained by microwaves with electron cyclotron resonance (ECR). The production of the plasma by ECR requires the presence of a magnetic field that makes it possible to define regions in which the frequency $f_0$ of the electric microwave field applied is equal to the gyration frequency of the electrons in the magnetic field of amplitude $B_0$, i.e.:

$$F_0 = eB_0/2\pi m_e \qquad (1)$$

where $m_e$ is the mass of the electron.

In FR 2 797 372 and FR 2 838 020, the magnetic field is produced by a permanent magnet (magnetic dipole) attached to the end of a coaxial microwave applicator. For this reason, these types of plasma are called multi-dipole plasmas. In particular, and as shown in FIG. 1, FR 2 838 020 teaches arranging permanent magnets 3 at a distance from the walls 1, owing to rods 4, in order to prevent the trajectories 6 of the electrons from cutting the walls 1, and that they are therefore collected on these surfaces.

FIG. 1 shows that FR 2 838 020 proposes a satisfactory solution with regard to the confinement of the plasma 10 since not field line 5 meets a surface or a wall 1, thus preventing direct losses of electrons on the walls.

However, the production of plasma by ECR, as described in FR 2 797 372 and FR 2 838 020 presents major disadvantages according to the method conditions of the elementary sources, namely:

1) the plasma 10 is preferably produced on the cylindrical portion around the magnet 3, and not on the front face of the magnet, as is preferable in numerous applications;

2) the pressure range of this technique is limited to low pressures, typically to the pascal (10 mtorr), because at higher pressures, the plasma is then produced essentially on the rear face of the magnet 3, and not the front face, which is the use side. The plasma production technique therefore remains limited to the low-pressure range;

3) in the case of a non-planar plasma source (cylindrical reactor), the placement of the permanent magnets at a distance from the walls reduces the effective plasma volume in the reactor.

Figure 2:
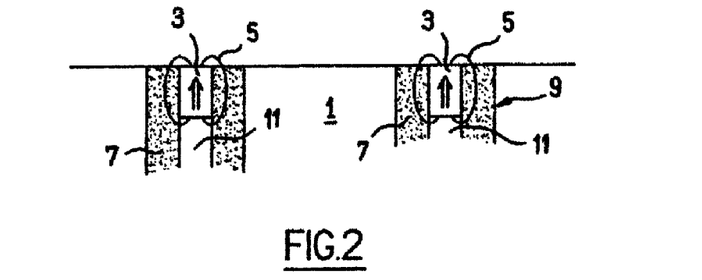

As shown in FIG. 2, FR 2 840 451 discloses a planar plasma source 10 in which the microwaves are applied to the plasma by coaxial propagation applicators 9 ending with a cross-section. As these applicators 9 are generally distributed according to square array, these types of plasma 10 are called matrix plasmas. In principle, the envisaged pressure range (10 to $10^3$ Pa) does not require a magnetic field, but FR 2 840 451 teaches the possibility of arranging a magnet 3 in the central core 11 of the applicator. In this case, the magnetic field lines 5 are necessary re-looped to the metal or dielectric walls of the chamber. In this case, the electrons accelerated with ECR are all collected on the coaxial applicator 9, which is catastrophic with regard to the plasma power budget. The confinement of the plasma is ineffective, as the magnet 3 serves only to provide the ECR conditions necessary for obtaining the breakdown of the plasma 10 at low pressures (on the order of one pascal to several dozen pascals).

U.S. Pat. No. 6,022,446 discloses a confinement device comprising, on one wall, magnets with radial magnetization, but in which the magnets are concentric with respect to one another. This structure requires the use of at least two magnet rims, with a complicated magnetic configuration, and is very poorly adapted for confinement without rotational symmetry, and is unsuitable for the production of two- or three-dimensional arrays.

DESCRIPTION OF THE INVENTION

The invention is intended to solve at least one of the aforementioned disadvantages.

To this end, the invention proposes a device for producing and/or confining a plasma according to claim 1.

The invention is advantageously completed with the features of claims 2 to 10.

The invention also relates to a method for producing and/or confining a plasma according to claim 11 or 12.

The invention has numerous advantages.

The invention makes it possible to confine dense plasmas of large dimensions, from very low pressures ($10^{-2}$ Pa or less) to a dozen Pa (pressure at which the magnetic confinement becomes ineffective). It is thus possible to work within a large pressure range, either with ECR coupling or with coupling by collisional absorption when the magnetic field becomes inoperative, i.e. when the frequency v of elastic collisions of the electrons becomes high with the pulsation $\omega_0 = 2\pi f_0$ of the electric microwave field ($v \gg \omega_0$), equal, with ECR, to the electron cyclotron pulsation $\omega_c$ ($\omega_0 = \omega_c$).

The invention proposed has numerous applications, in particular in the field of surface treatments, such as etching, deposition (PACVD or PAPVD), ion implantation by plasma immersion, to cite just a few examples.

The invention makes it possible to produce plasma in the pressure range of $10^{-3}$ to $10^3$ Pa, i.e. on the order of $10^{-5}$ to 10 torr (1 torr=133 Pa) for the following applications:

- surface treatments (cleaning, sterilization, etching, deposition, ion implantation, etc.),
- the production of new species (atoms, radicals, metastables, charged species, photons),
- the production of ion sources for any application requiring ion beams (single- or multi-charged ion sources), as well as
- any field requiring the production, on large surfaces or large volumes, of a uniform plasma.

Another advantage of the invention is the possibility of producing a confinement structure in which the magnetic field lines are all located in the same half-space, thus allowing for ideal confinement of the plasma in the low pressure range.

Indeed, with this type of magnetic configuration, the field lines never pass through the median plane of the magnet and the ECR areas generally surround the magnet, making it possible to overcome the disadvantages of the prior art, namely:

1) the field lines do not pass through any surface or wall, and therefore the electrons trapped on these field lines remain well confined;

2) if the magnet has sufficient magnetization, the ECR conditions and the field lines are located on the front face of the coaxial structure, thus enabling production of the plasma toward the effective volume.

Moreover, there is no decrease in the effective volume of plasma in the reactor, because the device advantageously does not comprise rods supporting the magnets toward the inside of the chamber.

Another advantage provided by the invention is the extension of the scale of plasma confinement and production. Indeed, there is no theoretical or even technological limitation to increasing the number of applicators, either on a planar surface or on a non-planar surface, for example a cylindrical surface. It is possible to supply microwave power to as many applicators as desired by as many independent generators as necessary, with or without power division. Each applicator can be powered by a coaxial cable since the microwave power necessary for each applicator is relatively low, thus resulting in the good reliability of the overall device.

Another advantage is the possibility of producing dense plasmas in the entire pressure range defined in the invention, from $10^{-2}$ Pa to $10^3$ Pa with the same applicator, and with a maximum coupling efficiency.

Indeed, owing to the invention, it is possible to maintain the plasma both in the ECR state (resonant coupling) and in the extra-ECR state, at a higher pressure (coupling by collisional absorption).

Another advantage is that, for magnets on the market and conventional method conditions (for example a microwave frequency $f_0$=2.45 GHz), the magnetic field intensity lines $B_0$ completely surround the annular magnet so that the microwaves cannot radiate outside of the area of the applicator without passing through an ECR coupling area, thus resulting in optimal coupling of the microwaves with a plasma at low and very low pressure.

For the ECR, it is possible to use microwave frequencies (5.8 GHz, 2.45 GHz, 920 MHz), but also lower frequencies (to one hundred MHz). Thus, the possibility of using frequencies much lower than 2.45 GHz makes it possible to consider, for each elementary source, unitary power supplies by power transistors.

DESCRIPTION OF THE FIGURES

Other features, objectives and advantages of the invention will become clear from the following description, provided purely for illustrative and non-limiting purposes, which must be read in reference to the appended figures in which.

In all of the figures, the same numeric references are used to designate similar elements.

DETAILED DESCRIPTION

To confer good plasma confinement and/or production efficiency on a multipole magnetic structure, the invention proposes that the trajectories of the charged particles coming from the plasma and trapped around a magnetic field line do not meet the walls (losses by the mechanism 3).

For this, it is necessary for the trajectories of the trapped electrons to be free of any obstacle between two mirror points M of equal magnetic field intensity.

Figure 4A:
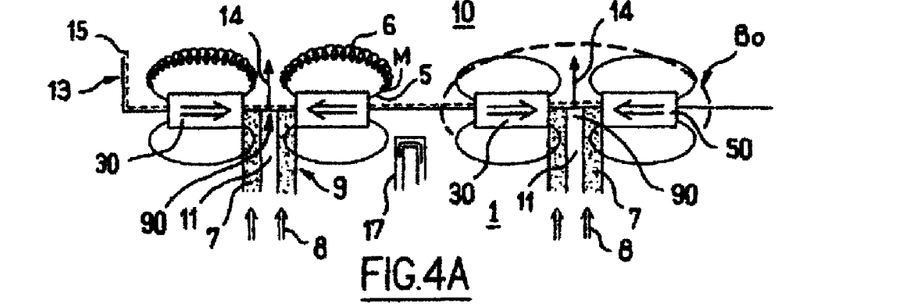
FIGS. 4A and 4B diagrammatically show respectively a cross-section view and a front view of a possible embodiment of the invention.
Figure 4B:
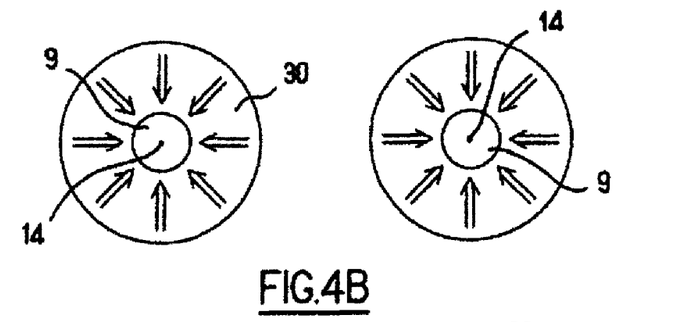

Thus, the invention proposes a device for producing and/or confining a plasma 10, which can be seen more specifically in FIGS. 4A and 4B.

The device comprises primarily a chamber 13, in the volume of which the plasma 10 is produced or confined.

The chamber 13 includes a wall 1 defining an envelope inside the chamber and surrounding the volume.

In the remainder of the description, the term "chamber" will be used to refer to the container in the volume of which the plasma 10 is produced or confined, in which a single device can thus be divided into a plurality of chambers, for example by internal partitions or additional walls separating the device.

The device comprises at least one annular magnet 30, centered on a normal 14 to the envelope.

The annular magnet 30 has a radial magnetization direction. It is moreover arranged near the wall 1 defining the envelope 15 supporting the normal 14, so that the magnetization direction is substantially perpendicular to said normal 14 to the envelope 15.

Such a configuration of the annular magnet makes it possible to confine the plasma, without the trajectories 6 of the trapped electrons meeting a wall 1 of the chamber.

In general, the annular magnet comprises primarily a radial magnetization, but also a symmetry with respect to a plane parallel to the radial magnetization direction, which can be called a median plane of the magnet.

To produce plasma 10, the device also comprises at least one elementary plasma source comprising a coaxial microwave applicator 9.

The applicator 9 passes through the wall 1 of the chamber and includes a central core 11.

The annular magnet 30 is centered on the central core 11 of the applicator 9. The annular magnet 30 with radial magnetization is placed around a free end 90 of the coaxial applicator for supplying microwaves.

In the case of confinement and/or production, only the magnetic field lines 5 at the front of a median longitudinal plane 50 of the magnet 30 are located on the plasma side 10, as shown in FIGS. 4A and 4B.

Indeed, the device of FIGS. 4A and 4B in particular makes it possible to solve the problems of the prior art. Indeed, the plasma is effectively confined. It can be produced opposite the applicator 9. In addition, the magnetic field $B_0$ does not disrupt the coupling by collisional absorption, which takes over the ECR when the pressure increases. Indeed, the configurations of the field lines 5 of the permanent magnet 30 mean that the latter go from one pole to the opposite pole without ever passing through the median plane 50 of the magnet 30.

The coaxial applicator 9 comprises a dielectric material 7 placed around the central core 11, at the wall 1 of the chamber. The dielectric material 7 can of course be placed below the wall, as indicated in FIG. 5C, or above the wall 1. The material 7 is thus placed over at least a portion of the length of the applicator 9.

A device according to the invention, for producing a device for confining a plasma 10 of large dimensions, comprises, according to two- or three-dimensional arrays, a plurality of annular magnets 30 with radial magnetization, arranged at the periphery of the plasma 10.

Very preferably, the magnets are not concentric with respect to one another, so that the magnetic field lines are looped back to the opposite pole of the same magnet. Thus, the field lines, which do not pass through the median plane of the magnet, do not pass through any wall of the chamber. In other words, the magnets are external to one another, in order to form the aforementioned arrays.

It can also comprise a plurality of elementary sources each comprising an applicator 9.

Figure 3A:
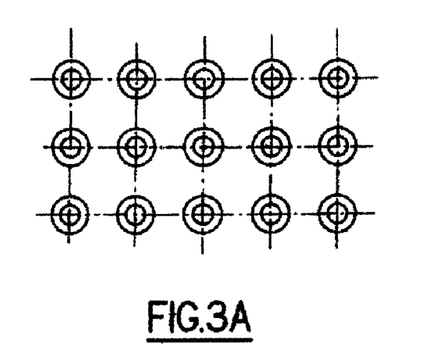
FIGS. 3A and 3B diagrammatically show two possible examples of two-dimensional arrays.
Figure 3B:
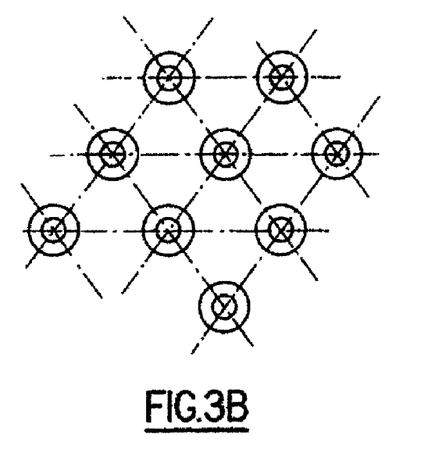

Each two- or three-dimensional array is, for example, rectangular or square, as shown in FIG. 3A, or hexagonal, as shown in FIG. 3B.

Thus, for elementary sources distributed according to two- or three-dimensional arrays, the device has a magnetic structure:
generating, by ECR (i.e. capable of generating the magnetic field of intensity $B_0$ necessary for ECR coupling), a plasma 10 essentially in the direction opposite the applicators 9, and
enabling, according to the shape of the free end 90 of the applicator 9, operation within a wide range of pressures, either by ECR coupling of the electric microwave field with the electrons (resonant coupling), or, at high pressure, by coupling by collisional absorption, when the magnetic field becomes inoperative.

The magnets 30 distributed according to two- or three-dimensional arrays can all have the same radial magnetization direction with respect to the walls 1 or the applicators 9 that they surround, or alternate directions. In other words, the radial magnetization can be centripetal (see, for example, FIG. 6B) for all or some of the magnets 30, and/or centrifugal (see, for example, FIG. 6A) for all or some of the magnets 30.

Similarly, only a portion of the annular magnets 30 (one 30 out of two magnets, or a row on two magnets 30, as non-limiting examples) can be powered with microwaves by an applicator 9.

As shown in FIG. 4A, the annular magnet 30 is at least partially in contact with the wall 1 of the chamber. The magnet 30 can thus be embedded in the wall 1 of the chamber up to a median plane 50 of the magnet 30. The free end 90 of the central core 11 is flush with the wall of the chamber.

The invention can have numerous alternatives with respect to the configuration proposed in FIGS. 4A and 4B. These alternatives concern in particular the position of the magnet 30 with respect to the coaxial applicator 9 and/or the shape of the free end 90 of the applicator.

Figure 5A:
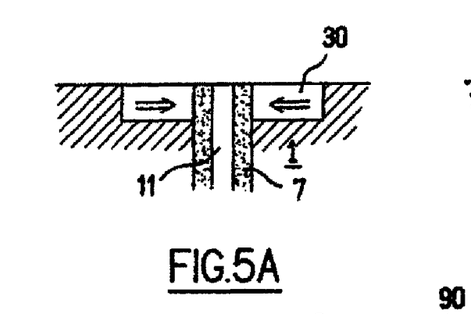
FIGS. 5A to 5C diagrammatically show cross-section views of possible embodiments of an applicator according to the invention.

FIG. 5A shows that the magnet 30 can be entirely embedded in the wall 1 of the chamber. In this case, the surfaces of the wall 1, the magnet 30, the dielectric material 7 and the central core 11 are at the same level.

Figure 5B:
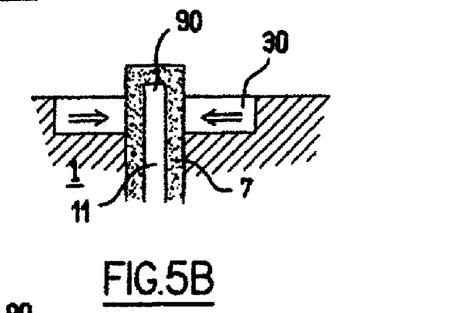
Figure 5C:
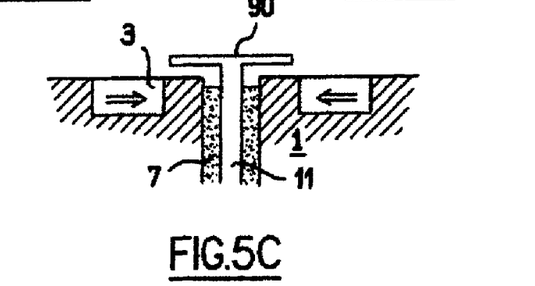

FIG. 5B shows that the central core 11 can go beyond the level of the wall 1. In this case as well, the dielectric material 7 can surround the central core 11 and cover the free end 90 of the applicator 9.

FIG. 5C shows that the free end 90 of the applicator can have a larger cross-section than that of the central core 11. In this case, the internal diameter of the magnet 30 is greater than the external diameter of the free end 90.

The magnets 30 can also be in contact only with the wall 1, or can be slightly above the wall 1, on supports.

These alternatives, presented as non-limiting examples, make it possible to optimize the elementary plasma sources according to the intended use or method (simple confinement of the plasma or confinement and production of plasma, effective pressure range, etc.). In particular, in order to prevent, under certain method conditions, the coupling of the plasma in the coaxial structure, it is often preferable, as indicated, to use an applicator entirely or partially filled with dielectric material 7.

Figure 6A:
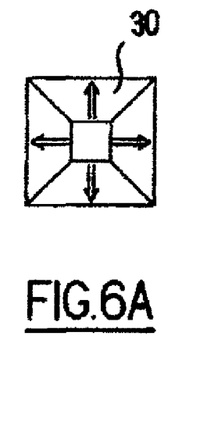
FIGS. 6A to 6C diagrammatically show examples of possible embodiments of an annular magnet.
Figure 6B:
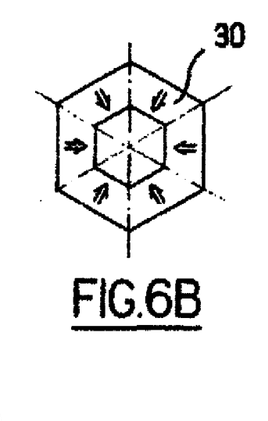
Figure 6C:
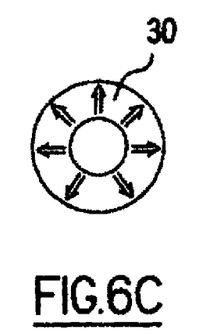

Magnets 30 with radial magnetization can also have various shapes. As shown in FIGS. 4B and 6C, the annular magnet 30 can be circular. FIGS. 6A and 6B show that the magnet 30 can also be polygonal, as well as square (FIG. 6A), hexagonal (FIG. 6B), octagonal, decagonal, and so on. But the circular annular shape is by far the most common and simplest to implement.

Figure 7A:
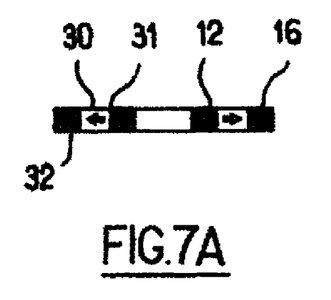
FIGS. 7A and 7B diagrammatically show respectively a cross-section view and a front view of a possible embodiment of the invention comprising an ingot iron material.
Figure 7B:
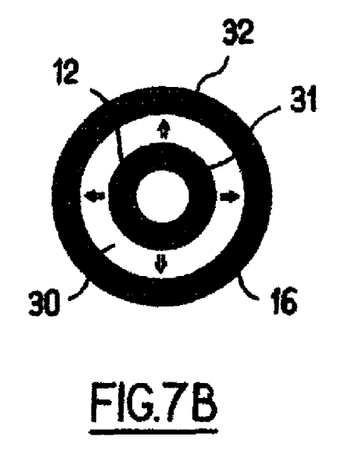

FIGS. 7A and 7B show that the magnet 30 has an internal periphery 31 and an external periphery 32.

Advantageously, the magnet 30 is surrounded on its internal 31 and/or external 32 periphery by a material with high magnetic permeability, for example in the form of rings 12 and/or 16. The rings 12 and/or 16 are, for example, ingot iron rings. The material with high magnetic permeability makes it possible to adjust the configuration of the field lines 5 at the magnetic poles of the magnet 30.

Figure 8:
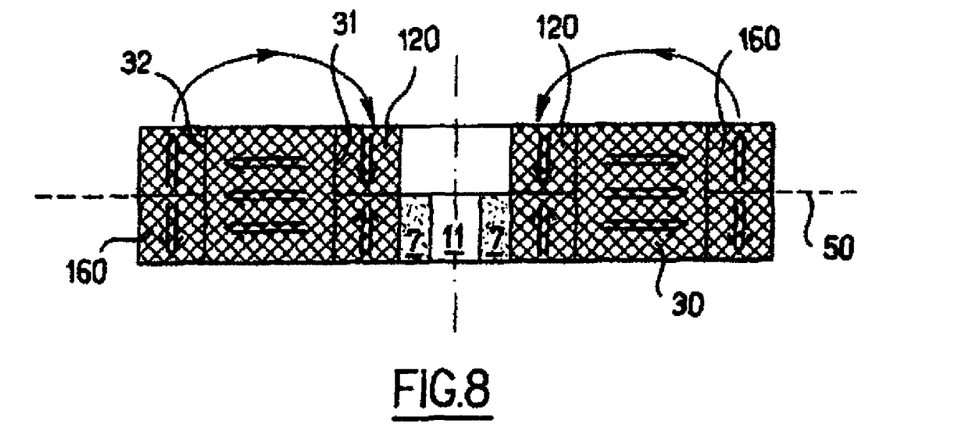
FIG. 8 diagrammatically shows a cross-section view of a possible embodiment of the invention, in which the ingot iron of FIGS. 7A and 7B is replaced, at the internal and/or external periphery, by magnet rings of opposite polarization so as to preferably preserve a symmetry with respect to the median plane of the magnet.

As shown in FIG. 8, advantageously, the magnet 30 is surrounded on its internal 31 and/or external 32 periphery by magnet rings 120 and/or 160. The magnet rings 120 and/or 160 have axial and not radial magnetization directions that make it possible to bring the poles, and therefore the field lines, above and below upper and lower planes of the annular magnet 30.

Figure 9:
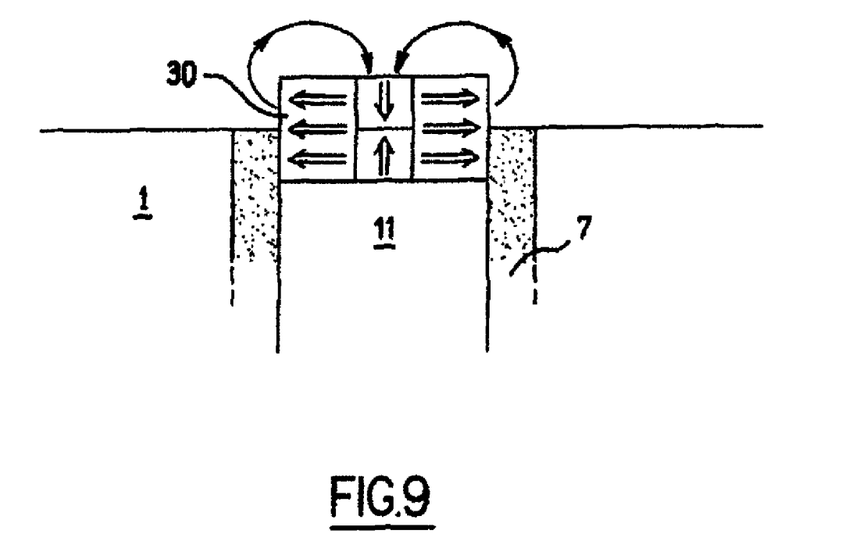
FIG. 9 shows an embodiment in which the annular magnet is located on the central core of the coaxial applicator instead of being located at the periphery of the coaxial applicator.

In addition, FIG. 9 shows that, if the central core 11 of the coaxial applicator 11 is very wide, the annular magnet 30 (another example) can be located on said core instead of being located outside of the coaxial structure.

Of course, the confinement and production of very dense plasmas (beyond $10^{10}$ cm$^{-3}$) require cooling of magnetic and coaxial structures, for example by circulation 17 of a gaseous or liquid heat-transfer fluid.

With the technology described, it is possible to produce planar sources of large dimensions, or cylindrical or spherical sources and/or chambers, according to the intended use.

The microwave frequency used is not critical, and it is therefore possible to use one of the ISM frequencies such as 915 MHz or 2.45 GHz, or even 5.8 GHz. For excitation of the plasma at the electron cyclotron resonance by microwaves at 2.45 GHz, the resonance conditions ($B_0$=0.0875 tesla) is easily satisfied by conventional permanent magnets, such as samarium-cobalt, or even barium ferrite or strontium ferrite magnets. This is all the more true at 100, 200 or 300 MHz, where the cost of power transistors is much lower than at 915 MHz or 2.45 GHz. The frequencies given as examples are of course non-limiting.

The invention claimed is:

1. A device for producing and/or confining a plasma, comprising
a chamber in a volume of which the plasma is produced or confined,
which chamber includes a wall defining an envelope inside the chamber and surrounding the volume,
at least one annular magnet with an axis of symmetry, having a centripetal or centrifugal radial magnetization direction, said magnet further having a median plane of symmetry parallel to said radial magnetization direction: such that the field lines of said permanent magnet do not pass through said median plane, and being at least partially embedded in the wall defining the envelope such that the axis of symmetry of said magnet coincides with a normal to the envelope considered at the location of the magnet, so that the magnetization direction is substantially perpendicular to said normal to the envelope;
wherein a plurality of annular magnets are arranged at the level of the wall in order to form a two- or three-dimensional array.

2. The device according to claim 1, in which the two or three-dimensional array has a square or lozenge lattice.

3. The device according to claim 1, also comprising at least one elementary plasma source comprising a coaxial microwave applicator including a central core, the applicator passing through the wall of the chamber, and wherein the annular magnet is centered on the central core of the applicator.

4. The device according to claim 1, in which the annular magnet is at least partially in contact with the wall of the chamber.

5. The device according to claim 1, in which the coaxial applicator comprises a dielectric material placed around the central core, at least over a portion of the length of the applicator.

6. The device according to claim 1, in which the annular magnet is circular or polygonal.

7. The device according to claim 1, in which the annular magnet has an internal periphery and an external periphery, and is surrounded on its internal and/or external periphery by a material with high magnetic permeability.

8. The device according to claim 1, in which each magnet generates a magnetic field of sufficient intensity to enable the production of plasma at low pressure by electron cyclotron resonance.

9. The device according to claim 3, in which the annular magnet is arranged outside the coaxial applicator.

10. The device according to claim 3, in which the annular magnet is arranged on the central core of the coaxial applicator.

11. A method for producing and/or confusing a plasma in a chamber, which chamber includes a wall defining an envelope inside the chamber and surrounding a volume, comprising a step consisting of arranging at least one annular magnet with an axis of symmetry, having a centripetal or centrifugal radial magnetization direction, said magnet further having a median plane of symmetry parallel to said radial magnetization direction, such that the field lines of said permanent magnet do not pass through said median plane, and being at least partially embedded in the wall defining the envelope such that the axis of symmetry of said magnet coincides with a normal to the envelope considered at the location of the magnet, so that the magnetization direction is substantially perpendicular to said normal to the envelope; comprising a step consisting of arranging a plurality of annular magnets at the level of the wall in order to form a two- or three-dimensional array.

12. The method according to claim 11, also comprising at least one step consisting of producing the plasma with at least one elementary plasma source comprising a coaxial microwave applicator including a central core, the applicator passing through the wall of the chamber, and the annular magnet also being centered on the central core of the applicator.

13. A device for producing and/or confining a plasma comprising
- a chamber in a volume of which the plasma is produced or confined,
- which chamber includes a planar wall defining an envelope inside the chamber and surrounding the volume,
- at least one annular magnet with an axis of symmetry, having a centripetal or centrifugal radial magnetization direction, said magnet further having a median plane of symmetry parallel to said radial magnetization direction, such that the field lines of said permanent magnet do not pass through said median plane, and being least partially embedded in the planar wall defining the envelope such that the axis of symmetry of said magnet coincides with a normal to the envelope considered at the location of the magnet, so that the magnetization direction is substantially perpendicular to said normal to the envelope,
- wherein a plurality or annular magnets are arranged at the level of the planar wall with the median plane of each of said annular magnets being parallel to said wall in order to form a two or three-dimensional array.

* * * * *

UNITED STATES PATENT AND TRADEMARK OFFICE
CERTIFICATE OF CORRECTION

PATENT NO. : 8,324,814 B2
APPLICATION NO. : 12/374478
DATED : December 4, 2012
INVENTOR(S) : Jacques Pelletier, Ana Lacoste and Stephane Bechu It is certified that error appears in the above-identified patent and that said Letters Patent is hereby corrected as shown below:

In the Claims:

Column 8, Claim 1, line 50, please delete ": such" and insert --, such--.

Column 10, Claim 13, line 30, please delete "or" and insert --of--.

Signed and Sealed this
Eleventh Day of June, 2013

Teresa Stanek Rea
*Acting Director of the United States Patent and Trademark Office*